United States Patent [19]

Havens

[11] 4,031,486
[45] June 21, 1977

[54] MEDIUM Q HIGH POWER DUAL CAVITY OSCILLATOR

[75] Inventor: Richard Calvin Havens, Scottsdale, Ariz.

[73] Assignee: Motorola, Inc., Schaumberg, Ill.

[22] Filed: May 26, 1976

[21] Appl. No.: 690,215

[52] U.S. Cl. .............................. 331/96; 331/101; 331/107 G
[51] Int. Cl.² ...................................... H03B 9/12
[58] Field of Search ................ 331/96, 101, 107 R, 331/107 G

[56] References Cited

UNITED STATES PATENTS 3,534,293  10/1970  Harkless .......................... 331/96 X
3,626,327  12/1971  Luchsinger et al. ........... 331/107 R Primary Examiner—Siegfried H. Grimm
Attorney, Agent, or Firm—Eugene A. Parsons

[57]   ABSTRACT

The dual cavity oscillator includes a pair of electromagnetically coupled resonators and a limited space charge accumulation (LSA) device disposed in one of the resonators. The resonators form a parallel resonance circuit at a first frequency and the LSA device and the pair of resonators form a series resonance circuit when the oscillator is operated at a second frequency which is generally within a few percent below the first frequency.

4 Claims, 1 Drawing Figure

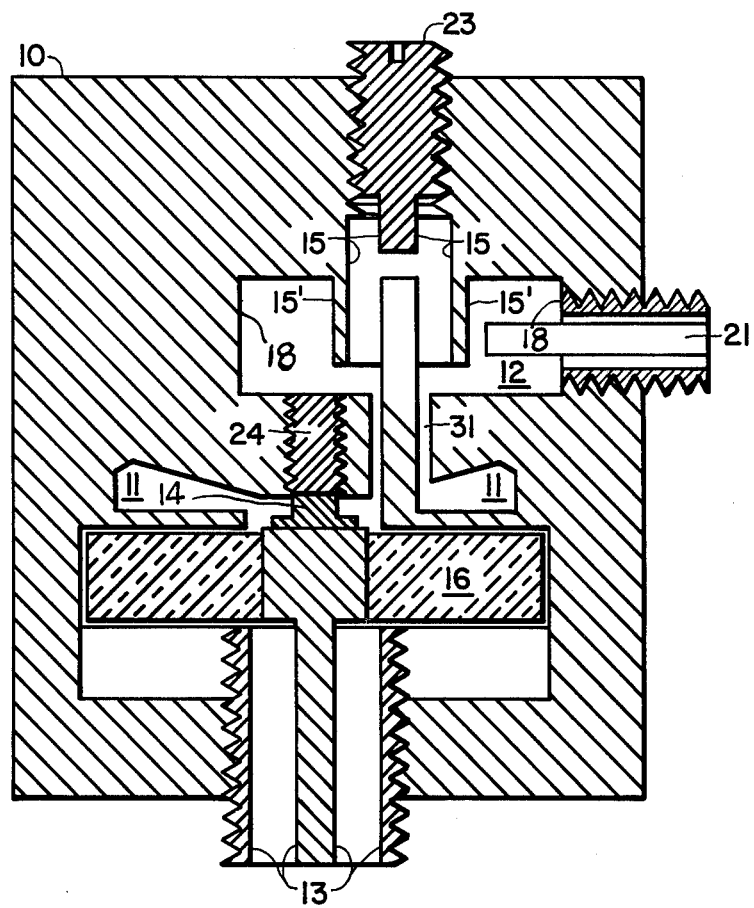

MEDIUM Q HIGH POWER DUAL CAVITY OSCILLATOR

FIELD OF INVENTION

This invention relates to a microwave oscillator and in particular to an improved medium Q high power microwave oscillator.

BACKGROUND OF THE INVENTION

In recent years in response to increasing demand for high frequency microwave oscillators, semiconductor elements, such as Gunn diodes or Impatt diodes, have been effectively utilized to develop the oscillators. While semiconductor microwave oscillators represent significant progress in the state of the art, in terms of size, simplicity, reliability, long life, etc., they have also presented certain shortcomings and problems of their own. For example, numerous applications require higher Q and better frequency stability. Significant progress has been made to overcome these shortcomings by numerous improved negative resistance microwave oscillators. Such an improved microwave oscillator is disclosed in the U.S. Pat. No. 3,913,035 issued on Oct. 14, 1975. As described therein the improved oscillator includes a semiconductor diode such as a Gunn or an Impatt diode located within a low Q resonance cavity for generating a carrier frequency, and a second resonance cavity tuned to the same frequency and having a very high Q relative to the first cavity and electromagnetically coupled to the low Q cavity. The microwave energy generated in the low Q cavity is coupled to the high Q cavity which reflects energy at the operating frequency back to the low Q cavity to maintain oscillations at this frequency, thereby enhancing the oscillator frequency stability. The microwave energy so developed is supplied to the load by a microwave passage that is coupled to the low Q cavity. An internal microwave load is employed to dissipate undesired frequencies thereby restricting these frequencies from being generated within the low Q cavity, thereby eliminating "moding."

While the aforementioned negative resistance high Q microwave oscillator of the aforementioned type provides stable frequency output, and advantages, it does not work with LSA devices. Avalanche breakdown occurs and prevents high Q oscillations from taking place. Therefore, there is still a need for higher Q semiconductor microwave oscillators that can utilize LSA devices, especially since higher pulsed peak power outputs can be obtained from LSA devices than from any other comparable type of negative resistace semiconductor device.

SUMMARY OF THE INVENTION

It is an object of the present invention to increase the Q factor of a microwave oscillator suitable for use with LSA devices.

It is still another object of the present invention to provide a microwave oscillator capable of operating at a high frequency, for example, in the range of 5 to 90 gigaHertz.

It is still a further object of the present invention to provide a high peak power pulsed microwave oscillator with improved frequency stability and RF spectrum.

In accordance with the present invention the aforementioned and other objects are attained by a microwave oscillator that includes a first resonator, a second resonator electromagnetically coupled to the first resonator, a negative resistance means electromagnetically coupled to the first resonator, means for supplying energy to the negative resistance means to generate RF energy, means for coupling the output of the second resonator electromagnetically to a load, wherein the first and second resonators form a parallel resonance circuit at a first frequency and wherein the negative resistance means and the first and second resonators form a series resonance circuit when the oscillator is operated at the second frequency which is within 20% below the first frequency but preferably within a few percent.

In accordance with another feature of the present invention a limited space charge accumulation (LSA) device is used as the negative resistance means for increasing the peak power output of the oscillator.

In accordance with still another feature of the present invention the first resonator includes a low Q radial mode resonator cavity and the second resonator includes a convoluted coaxial cavity for increasing the Q.

The foregoing and other objects and features of the present invention will become clearer from the following detailed description of an illustrative embodiment of the present invention.

BRIEF DESCRIPTION OF THE DRAWING

The single FIGURE is a sectional view of an oscillator embodying the present invention.

DETAILED DESCRIPTION

The accompanying drawing illustrates an oscillator that embodies the principles of the present invention. As shown, the oscillator includes a housing 10, a first or a lower Q resonance cavity 11 and a second or higher Q resonance cavity 12 electromagnetically coupled to the first cavity. The oscillator also is provided with a coaxial line input 13 for supplying the necessary input power to the LSA device 14, and a dielectric insulation RF choke 16 interposed between the first cavity and the input coaxial line. The oscillator is also provided with a suitable RF power output probe 21 to couple RF power out of the second resonance cavity. For tuning the first and second resonance cavities there is provided a conventional tuning screw 23 as illustrated.

As illustrated the first resonance cavity 11 is in the form of a generally known radial mode cavity. The second resonance cavity is in the form of a convoluted coaxial cavity. The first cavity is designed to provide lower Q oscillation and the second a higher Q oscillation. The LSA device is disposed in the first resonant cavity for providing the high power RF energy in the first resonant cavity when energized by the input power applied thereto through the coaxial line input 13.

According to an aspect of the present invention, the first and second resonator cavities are designed and they are coupled to each other so that they form a parallel resonant circuit at a given frequency, i.e. they display the electrical characteristics of a parallel resonant circuit, and that they together with the LSA device form a series resonance circuit, i.e. they display the electrical characteristics of a series resonant circuit, when the overall oscillator operates at a second frequency which is within a few percent below the first or given frequency. While the first and the second resonance cavities are shown in the form of a radial mode and a convoluted coaxial line cavity respectively, other types of resonant cavities may be used just as well, provided they are designed to meet certain criteria as follows.

The first resonant cavity is a low Q cavity that has a loaded Q value of 10 or less and that is of a design that has an operating frequency which is near the eventual operating frequency of the overall oscillator. The second resonant cavity is coupled to the first resonant cavity so as to substantially raise the loaded Q of the combined resonators. The second resonant cavity is coupled to the first resonance cavity by a conventional means such as a probe 31 shown in the accompanying drawing or a loop or any other suitable means. The first and second resonance cavities are designed so that the combined impedance of the first and second resonator is the complex conjugate of the optimum negative impedance of the LSA device. The two resonators are designed so that the circuit Q at the operating frequency of the combined first and second resonators is higher than the circuit Q of the first resonator by itself. Also the resonators are designed so that the combined first and second resonator impedance exhibits increasing inductive reactance or decreasing capacitive reactance as the operating frequency increases. This is to provide the necessary condition for series resonance. In addition the combination of the first and second resonators seen without the LSA device as seen by the LSA device, must exhibit a parallel resonant frequency which is higher than the operating frequency of the oscillator. It was found that the oscillator performed best when the parallel resonant frequency is a few percent higher than the operating frequency.

The oscillator shown in the drawing is an embodiment of a dual cavity resonator designed according to the foregoing principles.

Radial mode cavity 11 of relatively low Q was chosen to have a height at the negative resistance diode location 14 equal to that of the LSA device package height. The height was increased in the radial direction to keep the characteristic impedance approximately constant at all distances from the center of the cavity. However, this is not considered necessary and was done only for convenience. The radius of the radial mode cavity 11 was chosen to make the LSA device, mounted in the radial mode cavity, oscillate at approximately 5.2 GHz. The oscillator could actually be operative in this low Q mode by simply taking RF power out of the cavity through an output probe 31. Then resonator 12 is added to provide a parallel resonance slightly higher than the operating frequency.

The second resonance cavity was made of a convoluted dual coaxial line cavity. The dual coaxial line cavity 12 is formed by dual convoluted coaxial lines; one coaxial line is made of the probe 31 and outer conductor 15 and the other coaxial line is made of the inner conductor formed by the outer conductor 15' of the first coaxial line and outer conductor 18. The probe 31 is used as the interconnecting line between resonator 11 and resonator 12 and is made as short as physically possible. The outer coaxial lines were made of approximately 50Ω characteristic impedance and somewhat less than a quarter wavelength long at the desired operating frequency of 5.2 GHz. The parallel resonance then seen at diode location 14, without the LSA device included, was adjusted with tuning screw 23 to be approximately 5.35 GHz. The penetration or "coupling" of probe 21 is adjusted, along with minor adjustments to tuning screw 23 for maximum power output. Close to 100 watts peak power output at 0.001 duty factor with an external Q of approximately 50 at 5.2 GHz has been observed from an LSA device operating in a circuit as shown in the drawing and described above. In this manner, the LSA device oscillates at series resonance with the circuit providing increased Q and the complex conjugate of the optimum LSA device impedance. The increased Q is a result of the still higher Q parallel resonance that is exhibited by the circuit alone at approximately 5.35 GHz.

Advantageously it has been found that the present microwave oscillator has increased the Q of the oscillator, has improved the frequency spectrum over a wide range of temperatures, and has improved the frequency stability over temperature and exhibits a medium Q ( 50) resonant frequency output at high peak power without causing avalanche breakdown in the LSA device.

In operation the necessary DC bias required to energize the LSA diode is brought through the coaxial transmission line 13. When the power is applied to the LSA device 14, the radial mode cavity 11 begins to oscillate. In short time, for example, in less than a few tenths of a nanosecond, power builds up in the lower Q radial mode cavity 11. Power then builds up more slowly in the higher Q coaxial line cavity by virtue of the fact that the higher Q or the second cavity is electromagnetically coupled to the first cavity. The operation of the higher Q cavity then controls the output frequency and spectrum. This may take several nanoseconds. It is found in operation that the two cavities form a high Q parallel resonance circuit at a particular frequency. The LSA diode and the first and second resonators also form a medium loaded Q series resonant circuit in operation at the second frequency which is within a few percent below the first frequency. Operation in this manner enhances Q without causing avalanche breakdown of the LSA device.

Various modifications and changes may be made to the aforedescribed oscillator by one of ordinary skill without departing from the spirit and scope of the principles of the present invention and within the ambit of the following claims:

What is claimed is:
1. A microwave oscillator comprising:
   a first resonator:
   a second resonator electromagnetically coupled to the first resonator;
   negative resistance means electromagnetically coupled to the first resonator;
   means for supplying energy to said negative resistance means to provide RF energy;
   means for coupling the output of the second resonator electromagnetically to a load wherein said first and said second resonators form a circuit with the characteristics of a parallel resonant circuit at a first frequency and wherein said negative resistance means and said first and second resonators form a circuit with the characteristics of a series resonant circuit when the oscillator is operated at a second frequency which is within 20% below said first frequency.
2. The oscillator according to claim 1 wherein said negative resistance means is a limited space charge accumulation device.
3. The oscillator according to claim 1 wherein said first resonator includes a low Q radial mode resonant cavity and wherein said second resonator includes a high Q convoluted coaxial line cavity.
4. The oscillator according to claim 1 wherein said oscillator components are adjusted so that said oscillator operates at said second frequency which is within a few percent below said first frequency for optimal operation.

* * * * *